United States Patent
Saitou

(10) Patent No.: US 8,966,433 B2
(45) Date of Patent: Feb. 24, 2015

(54) SUPPORT METHOD, RECORDING MEDIUM STORING DESIGN SUPPORT PROGRAM AND SEMICONDUCTOR DEVICE

(71) Applicant: Fujitsu Limited, Kawasaki-shi, Kanagawa (JP)

(72) Inventor: Akiyoshi Saitou, Oota (JP)

(73) Assignee: Fujitsu Limited, Kawasaki (JP)

( * ) Notice: Subject to any disclaimer, the term of this patent is extended or adjusted under 35 U.S.C. 154(b) by 77 days.

(21) Appl. No.: 13/834,899

(22) Filed: Mar. 15, 2013

(65) Prior Publication Data
US 2013/0328156 A1    Dec. 12, 2013

(30) Foreign Application Priority Data
Jun. 11, 2012    (JP) .................... 2012-131624

(51) Int. Cl.
| | |
|---|---|
| *G06F 17/50* | (2006.01) |
| *H01L 27/02* | (2006.01) |
| *H01L 21/48* | (2006.01) |
| *H01L 23/50* | (2006.01) |

(52) U.S. Cl.
CPC ............ *G06F 17/5072* (2013.01); *H01L 27/02* (2013.01); *H01L 27/0207* (2013.01); *H01L 21/4853* (2013.01); *H01L 23/50* (2013.01); *H01L 2924/0002* (2013.01)
USPC ........... 716/137; 716/100; 716/111; 716/115; 716/132

(58) Field of Classification Search
USPC ........................ 716/100, 111, 115, 132, 137
See application file for complete search history.

(56) References Cited

U.S. PATENT DOCUMENTS 6,717,494 B2    4/2004    Kikuchi et al.

FOREIGN PATENT DOCUMENTS

| | | |
|---|---|---|
| JP | 9-205290 | 8/1997 |
| JP | 2003-8154 | 1/2003 |

*Primary Examiner* — Sun Lin
(74) *Attorney, Agent, or Firm* — Staas & Halsey LLP

(57) ABSTRACT

A design support method includes: selecting, by a computer, a power feed point of an integrated semiconductor circuit on a first board model in which a power supply layer and a ground layer are stacked; determining a first placement position of a first protrusion portion from the first board model on a side of the first board model, the first protrusion portion being corresponding to the power feed point; determining a second placement position of a second protrusion portion from the first board model on the side of the first board model, the second protrusion portion provided so as to separate from the first placement position by a distance; and placing the first protrusion portion and the second protrusion portion on the first placement position and the second placement position, respectively.

12 Claims, 12 Drawing Sheets

FIG. 7

| n m | 0 | 1 | 2 | 3 | 4 |
|---|---|---|---|---|---|
| 0 | 0.00 | 0.45 | 0.90 | 1.36 | 1.81 |
| 1 | 0.45 | 0.64 | 1.01 | 1.43 | 1.86 |
| 2 | 0.90 | 1.01 | 1.28 | 1.63 | 2.02 |
| 3 | 1.36 | 1.43 | 1.63 | 1.92 | 2.26 |
| 4 | 1.81 | 1.86 | 2.02 | 2.26 | 2.56 |

12a

SUPPORT METHOD, RECORDING MEDIUM STORING DESIGN SUPPORT PROGRAM AND SEMICONDUCTOR DEVICE

CROSS-REFERENCE TO RELATED APPLICATION

This application is based upon and claims the benefit of priority from the prior Japanese Patent Application No. 2012-131624 filed on Jun. 11, 2012, the entire contents of which are incorporated herein by reference.

FIELD

The embodiments discussed herein relate to a design support method, recording media storing a design support program, and a semiconductor device.

BACKGROUND

In a multilayer circuit board in which an integrated semiconductor circuit is placed on a board, a noise current flows to a power supply pin of the integrated semiconductor circuit placed on the board. This causes portions of a power supply layer and a GND layer to act as a resonator and generates radiation noise around the circuit board.

Japanese Laid-open Patent Publication No. 9-205290 discusses a related art.

SUMMARY

According to one aspect of the embodiments, a design support method includes: selecting, by a computer, a power feed point of an integrated semiconductor circuit on a first board model in which a power supply layer and a ground layer are stacked; determining a first placement position of a first protrusion portion from the first board model on a side of the first board model, the first protrusion portion being corresponding to the power feed point; determining a second placement position of a second protrusion portion from the first board model on the side of the first board model, the second protrusion portion provided so as to separate from the first placement position by a distance; and placing the first protrusion portion and the second protrusion portion on the first placement position and the second placement position, respectively.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 illustrates an exemplary table;

DESCRIPTION OF EMBODIMENTS

Figure 1:
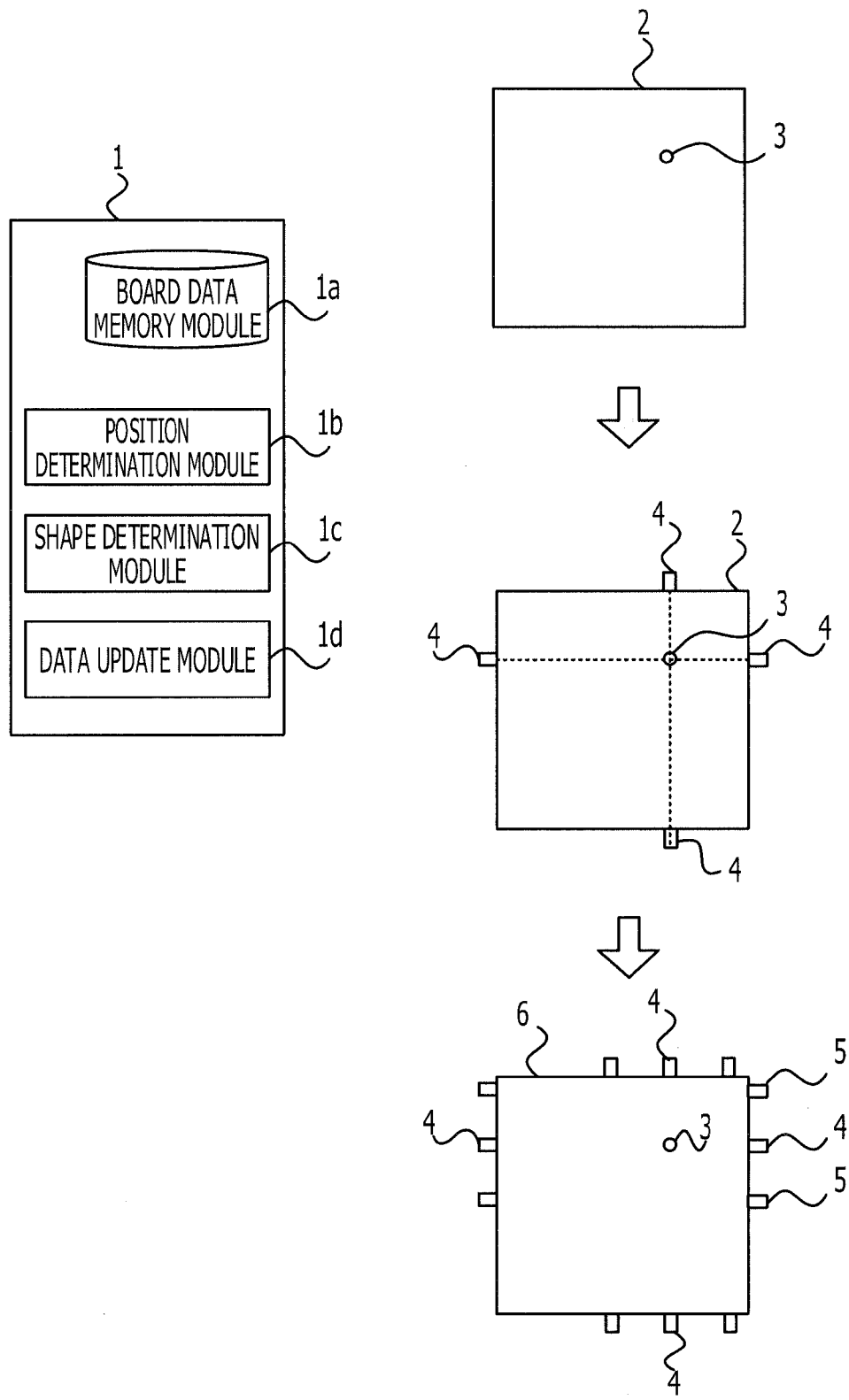
FIG. 1 illustrates an exemplary design support apparatus.

Bypass capacitors may be added to a circuit board as a countermeasure against radiation noise. A skilled designer may be able to find appropriate placement positions for the capacitors. A simulation may be performed to search the appropriate placement positions for the capacitors. FIG. 1 illustrates an exemplary design support apparatus.

The design support apparatus 1, for example, a computer 1, includes a board data memory module 1a, a position determination module 1b, a shape determination module 1c, and a data update module 1d. The board data memory module 1a may correspond to a data memory space such as a random access memory (RAM), a hard disk drive (HDD) or the like included in the design support apparatus 1. The position determination module 1b, the shape determination module 1c, and the data update module 1d may correspond to functions of a central processing unit (CPU) included in the design support apparatus 1.

The board data memory module 1a stores data relating to a target board to be designed. That data may include a size of the board and data of an integrated semiconductor circuit to be placed on that board. FIG. 1 also illustrates a board model 2 constructed based on the data stored in the board data memory module 1a. The board model 2 may be a model of a multilayer board in which a power supply layer and a ground layer are stacked on top of each other. The board data memory module 1a may be placed outside the design support apparatus 1.

The position determination module 1b determines placement positions of first protrusion portions 4 and second protrusion portions 5, which protrude out from the board model 2. An appropriate placement of the first protrusion portions 4 and the second protrusion portions 5 causes the phase of the radiation noise due to a resonance between the power supply layer and the ground layer to shift. As a result, a peak level of frequency may be reduced. In FIG. 1, the first protrusion portions 4 and the second protrusion portions 5 have rectangular shapes. However, the shapes are not limited thereto, and other shapes may be employed.

The position determination module 1b selects a power feed point 3 of the integrated semiconductor circuit to be placed on the board model 2. The power feed point 3 may be, for example, a power supply pin of the integrated semiconductor circuit or the like.

The position determination module 1b determines intersection points of perpendicular lines, which are drawn from the power feed point 3 to the respective sides of the board model 2, and the corresponding sides as the placement positions of the first protrusion portions 4. In FIG. 1, the first protrusion portions 4 are placed on the determined placement positions. The peak level of frequency may be reduced by placing the first protrusion portions 4 on the respective sides at the positions closest to the power feed point 3.

On each of the respective sides of the board model 2, the position determination module 1b determines a pair of placement positions of the second protrusion portions 5 in such a way that both the placement positions are each separated by a predetermined distance from the determined placement position of the first protrusion portion 4 on both sides thereof. The peak level of frequency may be reduced since the second protrusion portions 5 are placed at appropriate positions.

The shape determination module 1c determines the shapes of the first protrusion portion 4 and the second protrusion portion 5 based on a frequency to be input. For example, the shape determination module 1c obtains a wavelength based on the input frequency. The shape determination module 1c may set lengths of the first protrusion portion 4 and the second protrusion portion 5 to be one-eighth of the obtained wavelength. When the lengths of the first protrusion portion 4 and the second protrusion portion 5 exceed a predetermined reference value, the shape determination module 1c bends the first protrusion portion 4 and the second protrusion portion 5 so as that each one has an acute angled corner therein. Accordingly, the area of the board may be reduced while an effect on the function of the first protrusion portions 4 and the second protrusion portions 5 to reduce the peak level of frequency is being reduced.

The data update module 1d generates data of a board model 6 in which the first protrusion portions 4 and the second protrusion portions 5 having the determined shapes are placed at the determined placement positions of the board model 2. The data update module 1d overwrites the data to be stored in the board data memory module 1a. Thus, the data stored in the board data memory module 1a is updated.

The design support apparatus 1 generates, by simple method, the board model 6 that may reduce the peak level of the radiation noise since the first protrusion portions 4 and the second protrusion portions 5 are placed on the board model 2. No capacitance or the like may be added when modifying the phase. Accordingly, a process for searching appropriate placement positions of the capacitors or the like may be omitted. Thus, the countermeasure against noise may be easily implemented in the design stage.

In the board model 6 designed by the design support apparatus 1, the integrated semiconductor circuit receives a voltage supply through the power feed point 3. Therefore the phase of the radiation noise generated between the GND layer and the power supply layer may change compared to that of the board model 2. The peak level of the radiation noise may be reduced without adding any capacitor or the like.

Figure 2:
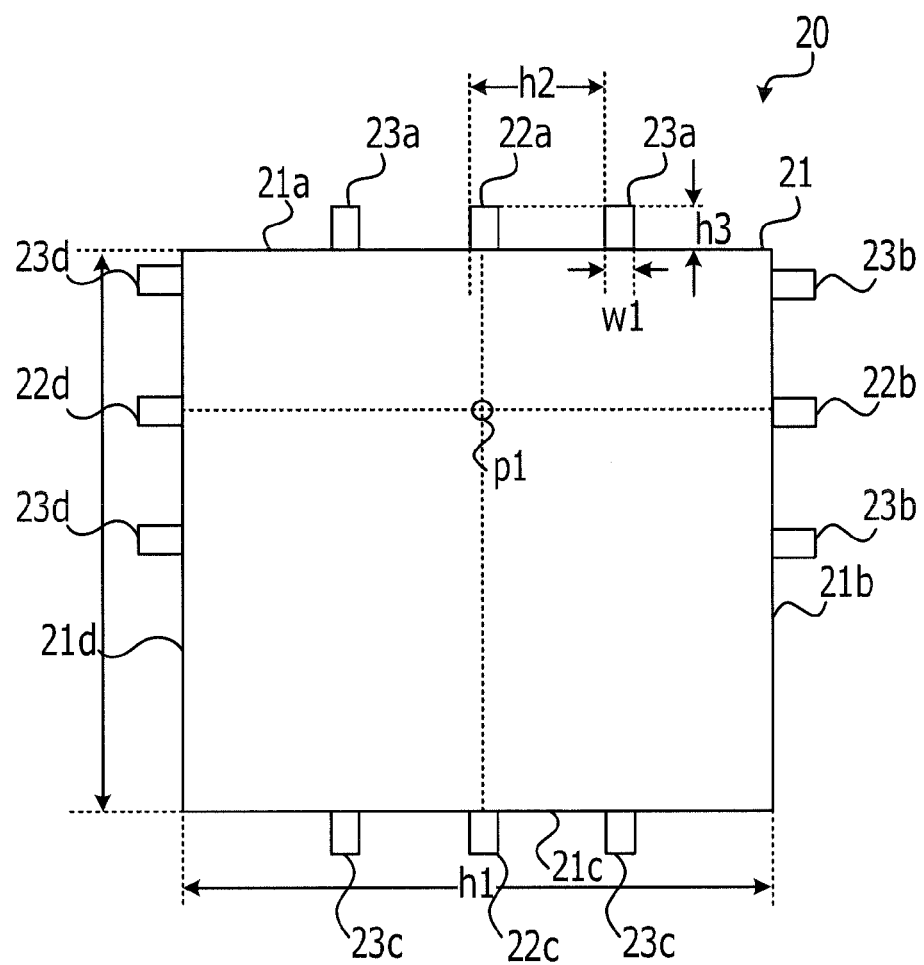
FIG. 2 illustrates an exemplary printed board model.
Figure 3:
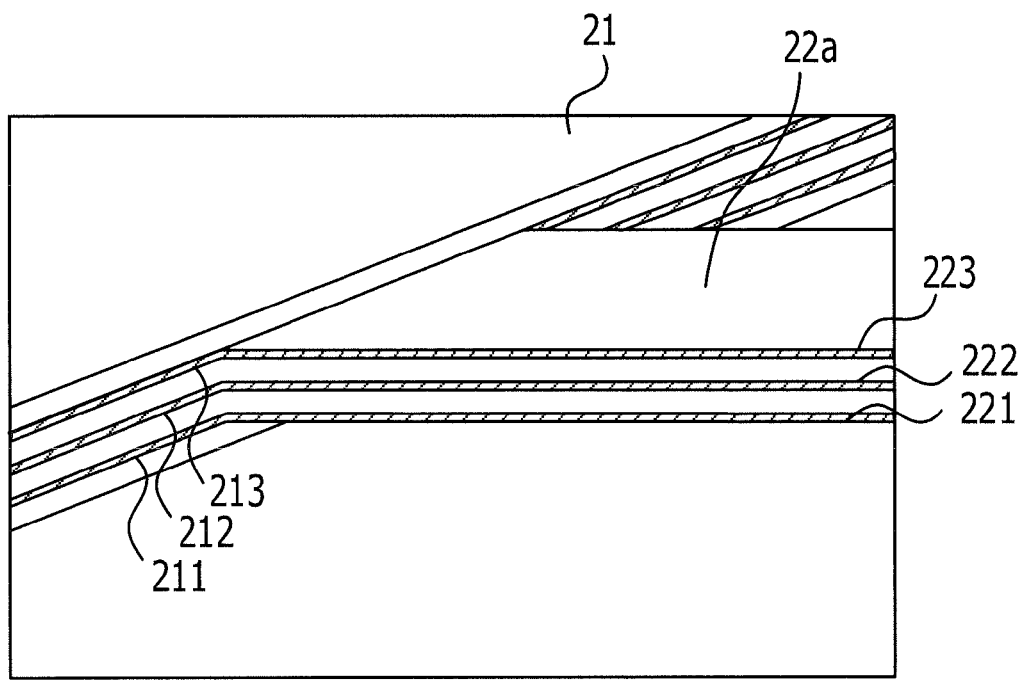
FIG. 3 illustrates an exemplary printed board model.

FIG. 2 and FIG. 3 illustrate an exemplary printed board model. The printed board model illustrated in FIG. 2 and FIG. 3 may be designed by the design support apparatus. The board model 20 includes a square base board 21. The base board 21 may be a multilayer board in which a GND layer 211, a power supply layer 212, and a GND layer 213 are stacked each other with insulation layers therebetween. A length h1 of each side of the base board 21 may be 150 mm. Protrusion structures 22a, 22b, 22c, and 22d, each of which protrudes out from the base board 21, are provided on the sides 21a, 21b, 21c, and 21d of the base board 21, respectively. The protrusion structure 22a is placed at an intersection point of the side 21a and a line that passes a power feed point p1 and is parallel to the side 21b (21d). The protrusion structure 22c is placed at an intersection point of the side 21c and that line. The protrusion structure 22b is placed at an intersection point of the side 21b and a line that passes the power feed point p1 and is parallel to the side 21a (21c). The protrusion structure 22d is placed at an intersection point of the side 21d and that line.

On the side 21a, protrusion structures 23a and 23a are provided on both sides of the protrusion structure 22a and being separated by a predetermined distance along the side 21a from the protrusion structure 22a. Protrusion structures 23b and 23b are provided on the side 21b and being separated by a predetermined distance along the side 21b from the protrusion structure 22b. Protrusion structures 23c and 23c are provided on the side 21c and being separated by a predetermined distance along the side 21c from the protrusion structure 22c. Protrusion structures 23d and 23d are provided on the side 21d and being separated by a predetermined distance along the side 21d from the protrusion structure 22d.

For example, the distance h2 between the left side of the protrusion structure 22a and the left side of the protrusion structure 23a may be 35 mm. For example, the protrusion structures 22a and 23a may each have a height h3 of 12 mm and a width w1 of 7 mm.

As illustrated in FIG. 3, a GND layer 221, a power supply layer 222, and a GND layer 223 of the protrusion structure 22a are coupled to the GND layer 211, the power supply layer 212, and the GND layer 213, respectively. The protrusion structures 22b-22d and 23b-23d may have connection relationships similar to the above.

The power supply layer 212 is provided with the power feed point p1 for supplying a voltage to the integrated semiconductor circuit. When a power supply voltage is supplied to the power feed point p1 and a noise current flows from the power feed point p1 to the power supply layer 212, the noise current may resonate between the GND layers 211 and 213 with the insulation layers in between them, and radiation noise may be generated from edge faces of the base board 21. That radiation noise may generate intense electric fields in the vicinity of positions where the perpendicular lines drawn from the power feed point p1 and the respective sides of the base board 21 meet. In the board model 20, the protrusion structures 22a-22d are placed at positions on the sides where the electric fields are intense. Thus, the phases at the intense electric field positions change. The peak value of the radiation noise may be reduced compared to the case where the protrusion structures 22a-22d are not placed.

Providing the protrusion structures 23a-23d may reduce the peak value of the radiation noise. Providing the protrusion structures 23a-23d may lessen an increase in plane area of the board model 20 compare to the case where the phase changes in accordance with increasing the plane area of the protrusion structures 22a-22d.

Figure 4:
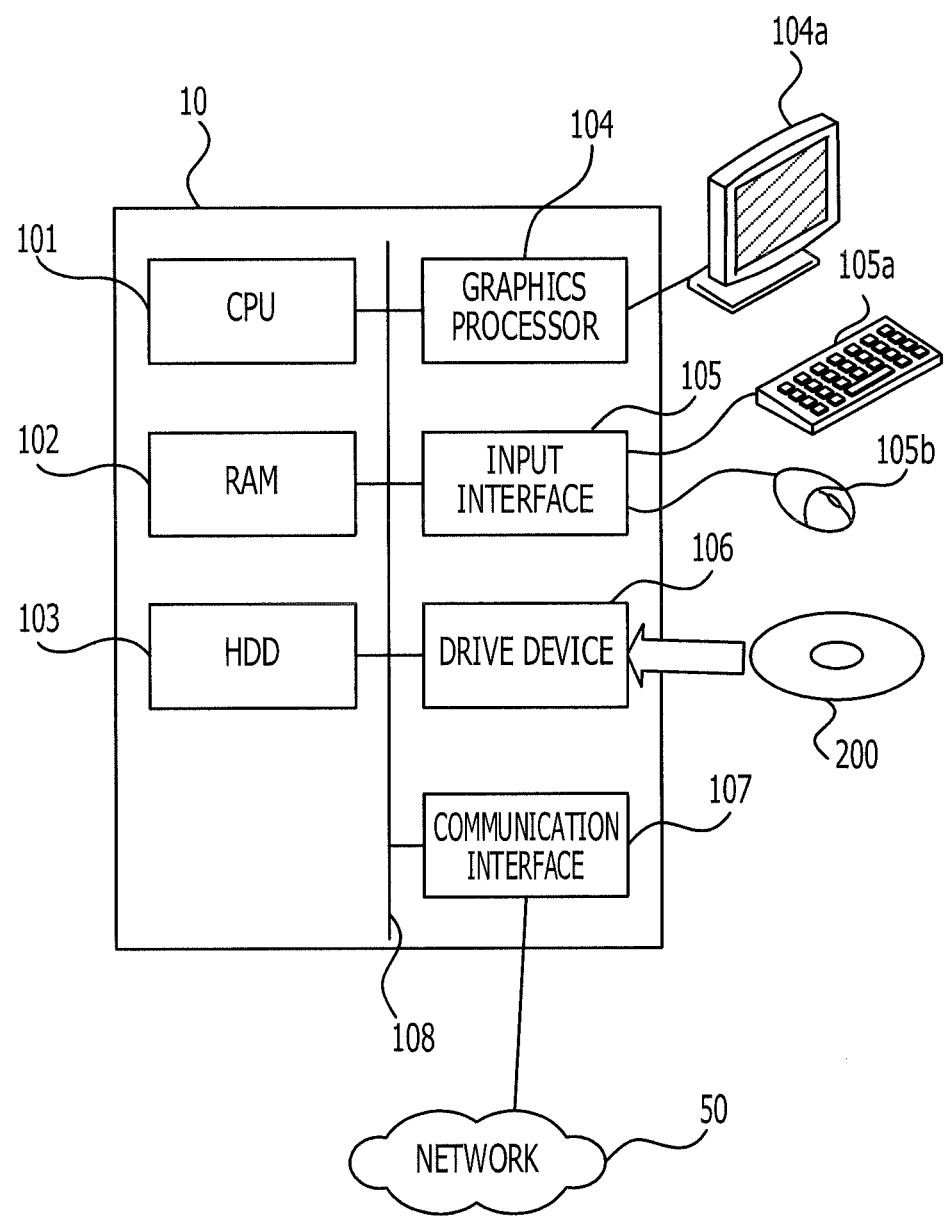
FIG. 4 illustrates an exemplary hardware configuration of a design support apparatus.

FIG. 4 illustrates an exemplary hardware configuration of the design support apparatus. The design support apparatus illustrated in FIG. 4 may design the printed board model illustrated in FIG. 2 and FIG. 3.

The design support apparatus 10 may be controlled by a CPU 101. The CPU 101 is coupled to a RAM 102 and a plurality of peripheral devices via a bus 108. The RAM 102 may be used as a primary memory device of the design support apparatus 10. The RAM 102 may temporarily store at least part of application programs or an operating system (OS) program to be executed by the CPU 101. The RAM 102 may store various data to be used during the processing of the CPU 101.

The bus 108 is coupled to a hard disk drive 103, a graphics processor 104, an input interface 105, a drive device 106, and a communication interface 107.

The hard disk drive 103 magnetically writes and reads data to and from a built-in disk. The hard disk drive 103 may be used as a secondary memory device of the design support apparatus 10. The hard disk drive 103 may store an OS program, application programs, and various data. As the secondary memory device, a semiconductor memory device such as a flash memory or the like may be used.

The graphics processor 104 is coupled to a monitor 104a. The graphics processor 104 displays graphics on a screen of the monitor 104a in accordance with commands of the CPU 101. The monitor 104a may include a display that uses a cathode ray tube (CRT), a liquid crystal display or the like.

The input interface 105 is coupled to a keyboard 105a and a mouse 105b. The input interface 105 receives signals from the keyboard 105a and the mouse 105b, and supplies them to the CPU 101. The mouse 105b may be a pointing device. For example, the pointing device may be a touch panel, a tablet, a touch pad, a tack ball or the like.

The drive device 106 reads data recorded in a portable recording medium, for example, a universal serial bus (USB) memory, an optical disc on which data is recorded in such a way that the data may be readable by use of light reflection, or the like. For example, when the drive device 106 is an optical drive device, data recorded on an optical disc 200 is read out by use of laser light or the like. The optical disc 200 may include a Blu-ray Disc (trademark), a digital versatile disc (DVD), a DVD-RAM, a compact disc read only memory (CD-ROM), a CD-R (recordable)/RW (rewritable) or the like.

The communication interface 107 is coupled to a network 50. The communication interface 107 transmits and receives data to and from another computer or a communication device via the network 50.

Figure 5:
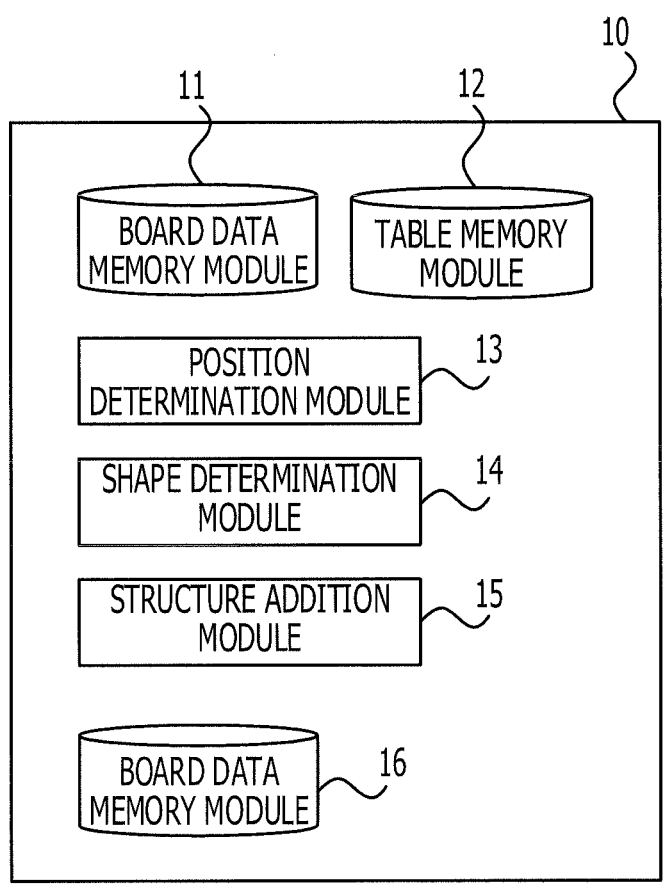
FIG. 5 illustrates an exemplary functional configuration of a design support apparatus.

FIG. 5 illustrates an exemplary functional configuration of the design support apparatus. The design support apparatus illustrated in FIG. 4 may have functions illustrated in FIG. 5. The design support apparatus 10 includes a board data memory module 11, a table memory module 12, a position determination module 13, a shape determination module 14, a structure addition module 15, and a board data memory module 16.

The board data memory module 11 stores board data of a target printed board to be processed. The board data memory section 11 may be placed outside the design support apparatus 10. The table memory module 12 stores a table to be used when the position determination module 13 determines the placement positions of the protrusion structures 23a-23d.

Figure 6:
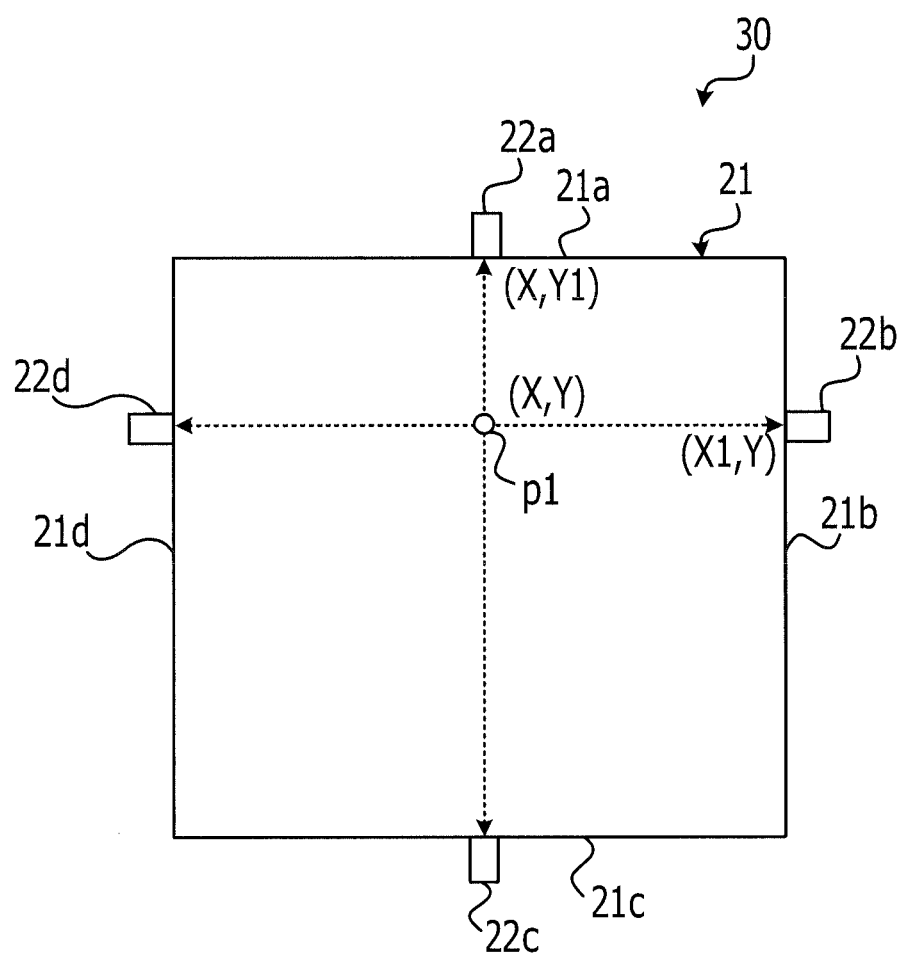
FIG. 6 illustrates an exemplary placement position determination method for protrusion structures.

The position determination module 13 determines the placement positions of the protrusion structures that have some noise reduction effects based on the position of the power feed point. FIG. 6 illustrates an exemplary example of a placement position determination method for a protrusion structure.

The position determination module 13 reads board data stored in the board data memory module 11. FIG. 6 illustrates a board model 30 based on the read board data. The same reference numerals may designate portions substantially the same as or similar to those of the board model 20.

The placement positions of the protrusion structures 22a, 22b, 22c, and 22d may be set on four sides 21a, 21b, 21c, and 21d of the base board 21 of the board model 30, respectively, at positions where these four sides and their corresponding perpendicular lines meet. These perpendicular lines are drawn from the power feed point p1 to the respective sides of the board model 30. The power feed point p1 may be a power feed point of an integrated semiconductor circuit that produces a largest radiation noise among integrated semiconductor circuits to be placed on the board model 30, or may be designated by a designer. The power feed point p1 may be the position of a single pin through which a voltage is supplied to an integrated semiconductor circuit, or a center position for a group of plural pins. The coordinate of the power feed point p1 may be represented as (X, Y). The coordinate of a contact point where the protrusion structure 22a and the side 21a meet may be represented as (X, Y1). The coordinate of a contact point where the protrusion structure 22b and the side 21b meet may be represented as (X1, Y).

The position determination module 13 calculates the coordinates of the positions at which the protrusion structure 23a having substantially the same shape as that of the protrusion structure 22a is placed in such a way that that those positions are each separated by the equal distance d1 to the left side and the right side from the protrusion structure 22a. For example, the equal distance may be calculated by the following equation (1).

$$f = \frac{C_0}{2\pi\sqrt{\varepsilon_r}}\sqrt{\left(\frac{m\pi}{a}\right)^2 + \left(\frac{n\pi}{b}\right)^2} \qquad (1)$$

where "f" is the frequency, $C_0$ is the speed of light, $\varepsilon_r$ is the relative permittivity of a base material, "a" and "b" are lengths of the sides of the power supply layer 212 (power supply plane), and "m" and "n" are integer values to be obtained. For example, "a" may be equal to the length of the side 21a (21c), and "b" may be equal to the length of the side 21b (21d). "f" may be arbitrarily determined by a designer. For example, "f" may be a peak level frequency of the target radiation noise to be reduced.

The position determination module 13 uses a combination of the obtained values "m" and "n" to divide each side of the board model 30 equally and to obtain the coordinates of the placement positions of the protrusion structures 23a. For example, the position determination module 13 refers to a table 12a (FIG. 7) to obtain a/m as the distance d1 between the protrusion structure 22a and the protrusion structure 23a in a direction along the side 21a. The position determination module 13 refers to the table 12a to obtain a/n as a distance d2 between the protrusion structure 22b and the protrusion structure 23b in a direction along the side 21b.

FIG. 7 illustrates an exemplary table. The table illustrated in FIG. 7 may be stored in the table memory module. In the table 12a, values of m are set in the row direction and values of n are set in the column direction. At an intersection of the values of m and n, the frequency (GHz) at which the radiation noise peak level is to be reduced is set. For example, when 2 GHz is the frequency at which the radiation noise peak level is to be reduced, the setting is m=4 and n=2, or m=2 and n=4.

Since the distances between the protrusion structures are obtained using the foregoing calculation method, the noise reduction effect may be improved for the case where the number of the protrusion structures 23a provided on both sides of the protrusion structure 22a is two.

Figure 8:
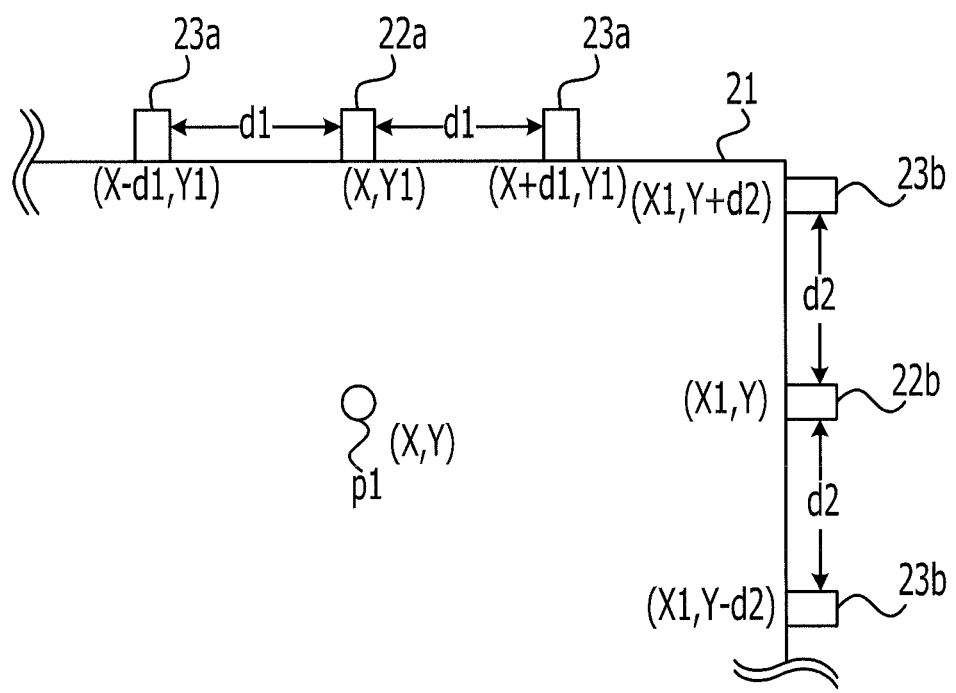
FIG. 8 illustrates an exemplary placement coordinate of a protrusion structure.

FIG. 8 illustrates an exemplary placement coordinate of a protrusion structure. The position determination module 13 sets the placement positions of the protrusion structures 23a and 23a to positions which are moved from the protrusion structure 22a to the left and right directions by the determined distance d1. The coordinate of the placement position of the protrusion structure 22a is (X, Y1). Thus, the coordinates of the protrusion structures 23a and 23a may be (X−d1, Y1) and (X+d1, Y1), respectively. The placement positions of the protrusion structures 23b and 23b may be set to positions which are moved from the protrusion structure 22b to the left and right directions by the determined distance d2. The coordinate of the placement position of the protrusion structure 22b is (X1, Y). Thus, the coordinates of the protrusion structures 23b and 23b may be (X1, Y+d2) and (X1, Y−d2), respectively. The placement positions of the protrusion structures may also be set on both sides of each of the protrusion structure 22c and the protrusion structure 22d although the illustrations thereof are omitted in FIG. 8.

The shape determination module 14 determines the shape of the protrusion structures, which are to be formed at their respective coordinates determined by the position determination module 13.

Figure 9A:
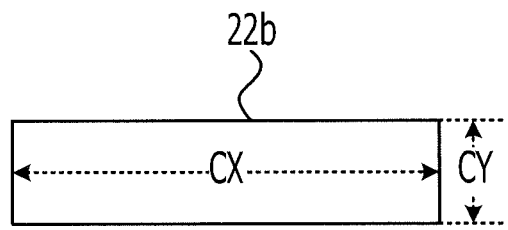
FIGS. 9A and 9B illustrate an exemplary shape determination method for protrusion structures.
Figure 9B:
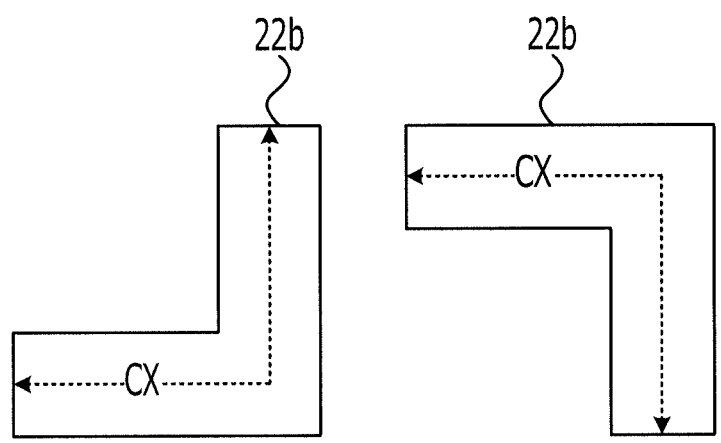

FIGS. 9A and 9B illustrate an exemplary protrusion structure. The protrusion structures illustrated in FIG. 9A and FIG. 9B may each be the protrusion structure 22b. The shape determination module 14 obtains a wavelength based on the frequency at which the radiation noise peak level is to be reduced. For example, the shape determination module 14 may set a length CX of the protrusion structure 22b to be one-eighth of the wavelength. The resonance of the protrusion structure 22b may be reduced. The length CX may be equal to one-eighth of the wavelength or less, and may be arbitrarily determined by a designer. The shape determination module 14 may, for example, set a width CY of the protrusion structure 22b to be one-sixteenth of the wavelength. The width CY may be equal to one-sixteenth of the wavelength or less, and may be arbitrarily determined by a designer. For example, the width CY may be 5 mm-7 mm.

The shape determination module 14 determines the shape of the protrusion structure 22b depending on whether the determined length CX of the protrusion structure 22b exceeds a reference value or not. For example, when the reference value is 20 mm and the length CX exceeds 20 mm, the shape determination module 14 sets the shape of the protrusion structure 22b to be a letter "L" shape as illustrated in FIG. 9B. The overall size of the board model 20, for example, the plane area thereof may be reduced. The shape of the protrusion structure 22b may be a letter "L" shape or a shape in which part of the protrusion structure 22b is bent so as to have an acute angled corner.

When the length CX is equal to 20 mm or less, the shape determination module 14 sets the shape of the protrusion structure 22b to be rectangular as illustrated in FIG. 9A. The structure addition module 15 forms the protrusion structures 22a-22d and 23a-23d having the shapes determined by the shape determination module 14 at the power supply layer 212 corresponding to the power feed point p1 and the GND layers 211 and 213 placed above and below the power supply layer 212. Data of the board model 20 to which the protrusion structures 22a-22d and 23a-23d are added may be stored in the board data memory module 16.

Figure 10:
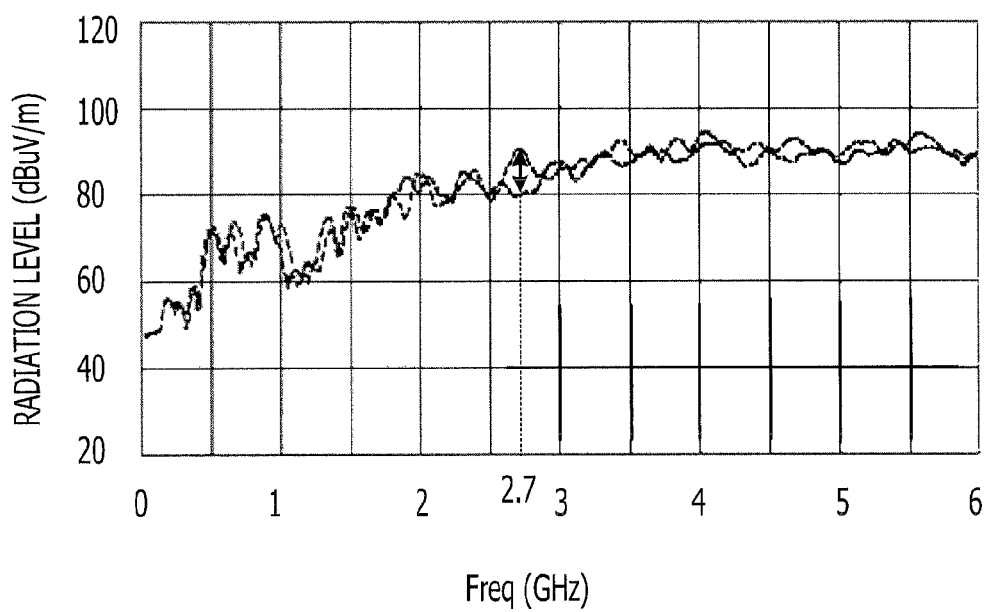
FIG. 10 illustrates an exemplary radiation noise measurement result.

FIG. 10 illustrates an exemplary radiation noise measurement result. The board data stored in the board data memory module 11 and the board data memory module 16 are prepared. The board data stored in the board data memory module 11 may be, for example, a board model (referred to as a pre-addition board model) based on the board data only for the base board 21. The board data stored in the board data memory module 16 may be, for example, the board model 20 based on the board data to which the protrusion structures 22a-22d and 23a-23d are added. A radiation level associated with the change in frequency of the voltage applied to the power feed point p1 is measured by simulation for the pre-addition board model and the board model 20.

Figure 11A:
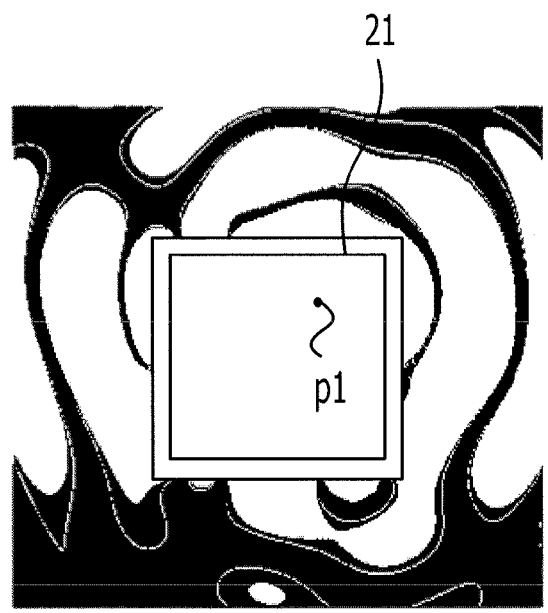
FIG. 11A and FIG. 11B illustrate an exemplary electric field distribution.
Figure 11B:
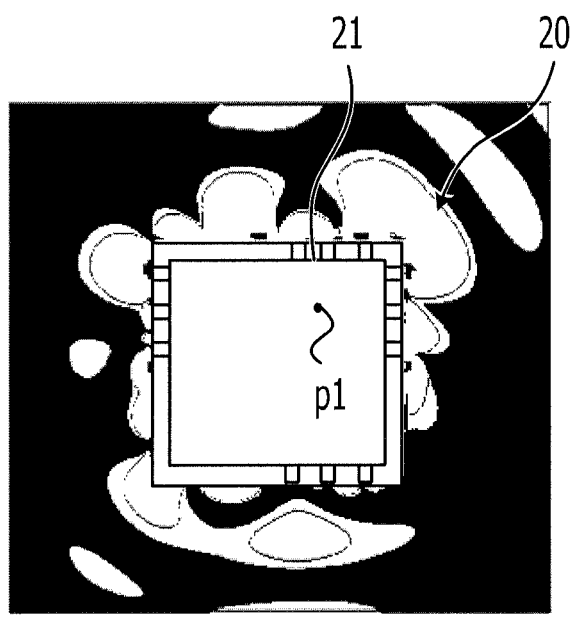

The measurement result of the board model 20 indicates that the noise may be reduced about 10 dB at around 2.7 GHz compared to the measurement result of the pre-addition board model. FIG. 11A and FIG. 11B illustrate an exemplary electric field distribution. FIG. 11A and FIG. 11B illustrate the electric field distributions of the respective boards during the simulation measurements.

FIG. 11A illustrates the electric field distribution due to the voltage applied to the power feed point p1 of the pre-addition board model at a frequency of 2.7 GHz and a phase of 90°. FIG. 11B illustrates the electric field distribution due to the voltage applied to the power feed point p1 of the board model 20 at a frequency of 2.7 GHz and a phase of 90°. In FIG. 11A and FIG. 11B, black color indicates areas outside the board model where the electric field is weak. Gray color indicates areas outside the board model where the electric field is strong. The color of the area becomes whiter as the electric field in that area becomes stronger. In the pre-addition board model illustrated in FIG. 11A, it may be confirmed that the strong electric field is distributed in concentric circles around the power feed point p1. In the board model 20 illustrated in FIG. 11B, the extent of the strong electric field distribution may be reduced.

FIG. 11A and FIG. 11B each illustrate the electric field distribution at a phase of 90°. The electric field distributions at phases of 0° and 150° may have substantially similar characteristics as that of the phase of 90°.

Figure 12:
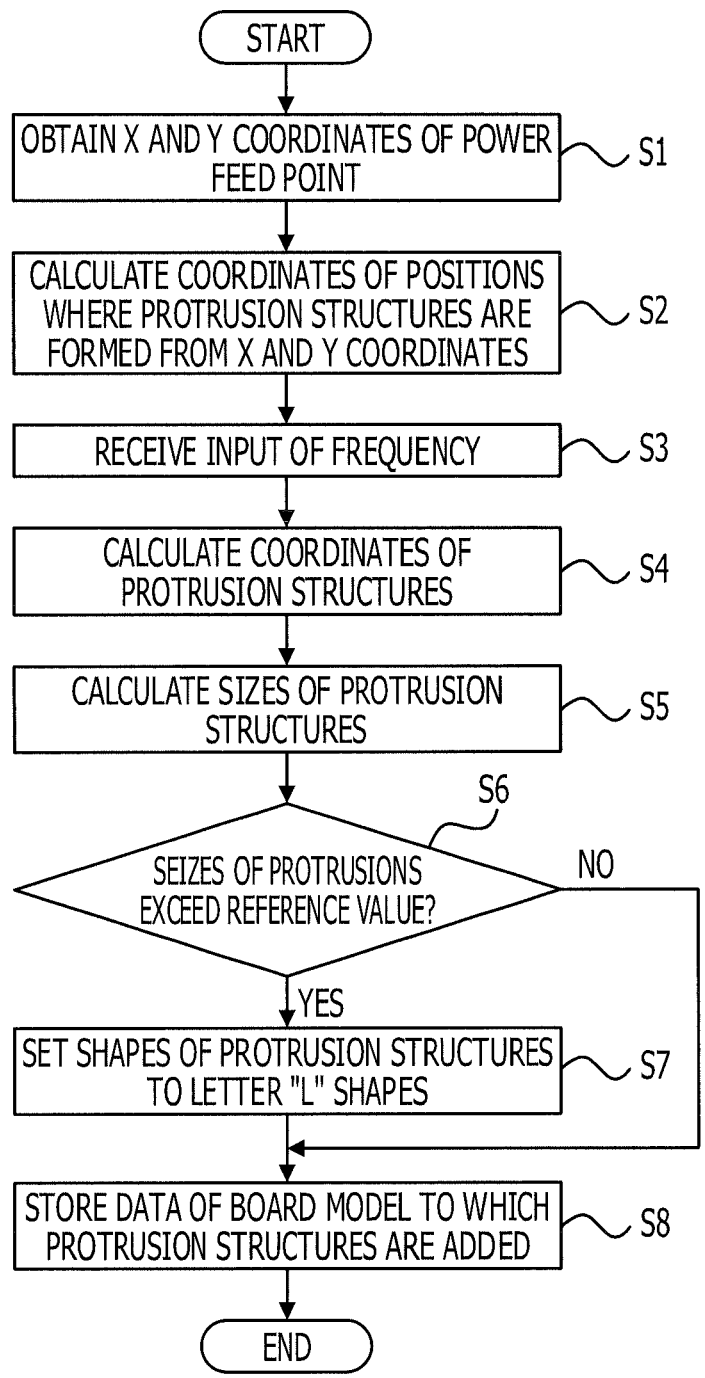
FIG. 12 illustrates an exemplary process of a design support apparatus.

FIG. 12 illustrates an exemplary process of a design support apparatus.

Operation S1: The position determination module 13 obtains a X coordinate and a Y coordinate of the power feed point p1 set on the base board 21 using the board data stored in the board data memory module 11. The process proceeds to an operation S2.

Operation S2: The position determination module 13 draws perpendicular lines from the X coordinate and the Y coordinate of the power feed point p1 obtained in the operation S1 to four sides 21a, 21b, 21c, and 21d of the base board 21. Coordinates of positions where the perpendicular lines meet the corresponding sides may be determined as placement positions of the protrusion structures 22a, 22b, 22c, and 22d. The process proceeds to an operation S3.

Operation S3: The position determination module 13 receives a frequency at which the radiation noise peak level is to be reduced. The process proceeds to an operation S4.

Operation S4: The position determination module 13 calculates the coordinates of the protrusion structures 23a-23d to be formed on the left and right sides of the respective protrusion structures 22a-22d using the equation (1) and the table 12a. The process proceeds to an operation S5.

Operation S5: The position determination module 13 calculates sizes of the protrusion structures 22a-22d and the protrusion structures 23a-23d. The process proceeds to an operation S6.

Operation S6: The shape determination module 14 determines whether or not the sizes of the protrusion structures 22a-22d and the protrusion structures 23a-23d obtained in the operation S5 exceed a reference value. When the sizes of the protrusion structures 22a-22d and the protrusion structures 23a-23d exceed the reference value (Yes in the operation S6), the process proceeds to an operation S7. When the sizes of the protrusion structures 22a-22d and the protrusion structures 23a-23d are equal to or less than the reference value (No in the operation S6), the process proceeds to an operation S8.

Operation S7: The shape determination module 14 sets shapes of the protrusion structures 22a-22d and the protrusion structures 23a-23d to letter "L" shapes. The process proceeds to the operation S8.

Operation S8: The structure addition module 15 adds the protrusion structures 22a-22d and the protrusion structures 23a-23d to the power supply layer 212 and the GND layers 211 and 213. The board data memory module 16 stores data of the board model 20 to which the addition is made. The process of FIG. 12 ends.

According to the design support apparatus 10, since the protrusion structures 22a-22d and the protrusion structures 23a-23d are placed on the base board 21, the board model 20 that reduces the peak level of the radiation noise may be generated using a simpler method. For example, since no capacitance or the like is not added, a process for searching an appropriate placement position for the capacitance or other similar processes may be omitted. The countermeasure against the noise may be easily implemented during the design stage.

In the board model 20 designed by the design support apparatus 10, the voltage is supplied to the integrated semiconductor circuit through the power feed point p1. Thus, the phase at which the radiation noise is generated between the GND layer and the power supply layer may be shifted compared to that of the pre-addition board model. The peak level of the radiation noise may be reduced without adding a capacitor or the like.

The number of the respective protrusion structures 23a-23d formed on sides of the corresponding protrusion structures 22a-22d may be two. The number may also be one, or three or more.

The process of the design support apparatus 10 may be distributed to a plurality of devices for distributed processing. For example, one device may determine the placement positions of the protrusion structures 22a-22d and 23a-23d, and another device may determine the shapes of the protrusion structures 22a-22d and 23a-23d.

The configuration of each portion of the design support program, the design support method, and the semiconductor device may be replaced with any arbitrary configuration that has a substantially similar function. Any other additional constituting elements or processes may be added.

Any two or more of the foregoing portions or features may be combined. The foregoing process functions may be implemented by a computer. One or more programs describing the processes of the functions that are performed by the design support apparatuses 1 and 10 may be provided. Executing such programs on a computer allows to implement the foregoing processes on that computer. The programs describing the processes may be recorded on a computer-readable recording medium. The computer-readable recording medium may include a magnetic memory device, an optical disc, a magneto-optical recording medium, or a semiconductor memory. The magnetic memory device may include a hard disk drive, a flexible disk (FD), or a magnetic tape. The optical disc may include, but not limited to, a DVD, a DVD-RAM, or a CD-ROM/RW. The magneto-optical recording medium may include a magneto-optical disc (MO) or the like.

For marketing of the programs, for example, portable recording media such as DVDs, CD-ROMs, and the like, in which the programs are recorded, may be offered for sale. The programs stored in a memory device of a server computer may be transferred from the server computer to other computers through networks.

For example, a computer that executes the programs may store the programs recorded in the portable recording medium or transferred from the server computer in a memory device. The computer reads the programs from the memory device thereof, and performs processes according to the programs. The computer may execute the programs that are directly read from the portable recording medium. The computer may execute the programs that are transferred from the server computer, which is coupled to the computer via a network.

At least part of the foregoing processes may be implemented by an electronic circuit such as a digital signal processor (DSP), an application specific integrated circuit (ASIC), or a programmable logic device (PLD).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A design support method comprising:
    selecting, by a computer, a power feed point of an integrated semiconductor circuit on a first board model, which is rectangular in shape, in which a power supply layer and a ground layer are stacked;
    determining a first placement position of a first protrusion portion from the first board model on a side of the first board model, the first protrusion portion physically corresponding to the power feed point;
    determining a second placement position of a second protrusion portion from the first board model on the side of the first board model, the second protrusion portion provided so as to separate from the first placement position by a distance; and
    placing the first protrusion portion and the second protrusion portion on the first placement position and the second placement position, respectively.

2. The design support method according to claim 1, wherein
    the first placement position is set at each of four sides of the first board model.

3. The design support method according to claim 1, wherein
    the first placement position is set at an intersection point of the side and a perpendicular line drawn from the power feed point to the side.

4. The design support method according to claim 1, wherein
    the second placement position is determined based on a frequency of a signal to be input to the integrated semiconductor circuit, a relative permittivity of an insulation layer of the first board model, and a length of the side of the first board model.

5. The design support method according to claim 1, wherein
    a first shape of the first protrusion portion and a second shape of the second protrusion portion are determined based on a frequency of a signal to be input to the integrated semiconductor circuit.

6. The design support method according to claim 5, wherein
    a first length of a protruding part of the first protrusion portion and a second length of a protruding part of the second protrusion portion are determined based on the frequency of the signal to be input to the integrated semiconductor circuit, the protruding parts of the first protrusion portion, and the second protrusion portion from the first board model.

7. The design support method according to claim 6 further comprising, bending a protruding part of at least one of the first protrusion portion and the second protrusion portion with an acute angle when at least one of the first length and the second length is equal to or longer than a predetermined length.

8. The design support method according to claim 1 further comprising, generating a second board model in which the first protrusion portion is placed in the first placement position and the second protrusion portion is placed in the second placement position.

9. A non-transitory recoding medium storing a design support program to be executed by a computer, the program comprising a set of codes for causing the computer to execute operations of:
- selecting, by a computer, a power feed point of an integrated semiconductor circuit on a first board model, which is rectangular in shape, in which a power supply layer and a ground layer are stacked;
- determining a first placement position of a first protrusion portion from the first board model on a side of the first board model, the first protrusion portion physically corresponding to the power feed point;
- determining a second placement position of a second protrusion portion from the first board model on the side of the first board model, the second protrusion portion provided so as to separate from the first placement position by a distance; and
- placing the first protrusion portion and the second protrusion portion on the first placement position and the second placement position, respectively.

10. A semiconductor device comprising:
- a board, which is rectangular in shape, in which a power supply layer and a ground layer are stacked;
- first protrusion portions having a respective protruding part from the board and provided on a respective side of the board, each of the first protrusion portions being placed at a minimum distance between the respective side and a power feed point of an integrated semiconductor circuit on the board; and
- second protrusion portions having a respective protruding part from the board and provided placed on the respective side of the board, each of the second protrusion portions being separated by a distance from the respective first protrusion portion.

11. The semiconductor device according to claim 10, wherein
at least one of the first protrusion portion and the second protrusion portion has a rectangular shape.

12. The semiconductor device according to claim 10, wherein
at least one of the first protrusion portion and the second protrusion portion has a shape including a predetermined acute angled corner.

* * * * *

UNITED STATES PATENT AND TRADEMARK OFFICE
CERTIFICATE OF CORRECTION

PATENT NO. : 8,966,433 B2
APPLICATION NO. : 13/834899
DATED : February 24, 2015
INVENTOR(S) : Akiyoshi Saitou It is certified that error appears in the above-identified patent and that said Letters Patent is hereby corrected as shown below:

On the Title Page, Item [54] and in the Specification, Column 1, Line 1, Title, Before "SUPPORT" insert -- DESIGN --.

Signed and Sealed this
Twenty-first Day of July, 2015

Michelle K. Lee
*Director of the United States Patent and Trademark Office*